United States Patent [19]
Buss

[11] 3,942,034
[45] Mar. 2, 1976

[54] CHARGE TRANSFER DEVICE FOR FREQUENCY FILTERING RESPECTIVE TIME SEGMENTS OF AN INPUT SIGNAL

[75] Inventor: Dennis D. Buss, Richardson, Tex.

[73] Assignee: Texas Instruments Incorporated, Dallas, Tex.

[22] Filed: Dec. 28, 1973

[21] Appl. No.: 429,229

[52] U.S. Cl............... 307/221 D; 307/304; 333/29; 333/70 T; 343/7.7; 357/24
[51] Int. Cl.² .. G11C 19/00; H03H 9/00; G01S 9/42
[58] Field of Search............ 307/221 C, 221 D, 293, 307/304; 357/24; 343/5 DP, 7.7; 333/29, 70 T

[56] References Cited
UNITED STATES PATENTS

| | | | |
|---|---|---|---|
| 3,474,260 | 10/1969 | Frohbach.................... | 307/221 D |
| 3,500,215 | 3/1970 | Leuthold et al.............. | 307/221 D |
| 3,546,490 | 12/1970 | Sangster...................... | 307/221 D |
| 3,763,480 | 10/1973 | Weimer........................ | 307/221 C |
| 3,764,824 | 10/1973 | Sangster...................... | 307/221 C |
| 3,787,852 | 1/1974 | Puckette et al.............. | 343/7.7 |
| 3,809,923 | 5/1974 | Esser........................... | 307/221 D |

OTHER PUBLICATIONS

"The Bucket-Brigade Delay Line" by Sangster in Philips Technical Review Vol. 31, 1970, No. 4, pp. 97-110.

Primary Examiner—Stanley D. Miller, Jr.
Attorney, Agent, or Firm—Harold Levine; James T. Comfort; Richard L. Donaldson

[57] ABSTRACT

A charge transfer device comprising a time demultiplexer for separating in time, segments of a signal, such as a return radar video, and filtering the output from each time segment in order to a) reject zero doppler clutter or b) determine the frequency of the principal signal present indicative of the doppler shift of a related target within that time segment.

15 Claims, 3 Drawing Figures

CHARGE TRANSFER DEVICE FOR FREQUENCY FILTERING RESPECTIVE TIME SEGMENTS OF AN INPUT SIGNAL

BACKGROUND OF THE INVENTION

1. Field of the Invention

This invention pertains to charge transfer devices and more specifically to a range gate filter incorporating charge transfer devices, such as may be used in a moving target radar system. Operating principles of such systems are described in "Introduction to Radar Systems", M. I. Skolnik, published by McGraw-Hill Book Company, in particular Chapter 4.

2. Description of the Prior Art

Moving target radar uses the effect of doppler shift to isolate moving targets in the presence of zero doppler clutter as well as to determine the movement characteristics of such target, i.e., the speed and relative direction of movement. Long range radar may receive many returns from many targets. It is desirable that complete information be made substantially simultaneously for each of the targets.

A source sending a radar signal receives returns at different time intervals from a plurality of targets depending on the relative distance each target is from the source. That is, a close target return will return to the source relatively sooner than a far target return. It is apparent that the returns from a plurality of targets all resulting from one transmission are time sequential. By identifying each target with a time range, one target return may be discriminated from all other target returns.

In order to perform the association of each target with a particular time slot, the time of receipt of the target range of interest may be divided into time bins. Then each time bin may be separately interrogated to determine the characteristics of any targets that may be present.

The frequency of the signals within each time bin is indicative of relative movement of source and target, the time bin itself being indicative of location. The frequency carries this information since it is directly related by a well-known relationship to doppler shift and hence to relative movement.

Charge transfer devices have been employed in time demultiplexers to isolate one time bin or segment from the total target range. Essentially, such a demultiplexer receives all signal data in sequential order and progresses the data through a register. The register, loaded serially, is then outputted in parallel to a plurality of frequency filters to produce the separate information related to each time bin.

Separate conventional bandpass filters for each time bin site have been employed. It is not uncommon to have on the order of 60 time bins. To perform adequate filtering of each time bin in a conventional manner requires either a plurality of filters or an active filter that sweeps through the entire frequency range of interest. Such a filtering system is bulky and expensive. Time sharing filtering action to reduce the number of filters is not satisfactory since this inherently introduces delays in operation of the overall system and negatives the advantages of being able to detect multiple targets in a time shared return.

Therefore, it is a feature of this invention to provide a range gate filter comprising a time demultiplexer and a filtering system both employing charge transfer devices.

It is another feature of this invention to provide filtering of the frequencies in a moving target radar return using a transversal filter made from a charge transfer device.

SUMMARY OF THE INVENTION

A preferred embodiment of the invention is a charge transfer device (CTD) for performing transversal filtering in each of a plurality of time segments of an applied input. The device comprises a demultiplexing charge-transfer shift register that progresses the input through its sites and clocking means for clocking out in parallel information from the sites of the demultiplexing shift register, each site being related to signals of a particular time occurrence. A CTD transversal filter is connected to receive the data from each site. Means is connected to each transversal filter for obtaining the filtered output in the time segment signal assigned to the filter. Either a charge-coupled device (CCD) or a bucket brigade device (BBD) may be employed as the charge transfer device. The filter may have a broad bandpass characteristic for rejecting zero doppler clutter and passing all non-zero doppler signals; alternatively it may have a narrow band characteristic for determining the precise doppler frequency with high sensitivity in conjunction with a variable frequency local oscillator.

By using CTD's for both demultiplexing and filtering, production is greatly simplified, bulk is reduced, all at a great savings. It may be convenient even to put CTD's functionally operating together on the same semiconductor chip.

BRIEF DESCRIPTION OF THE DRAWINGS

So that the manner in which the above-recited features, advantages and objects of the invention, as well as others which will become apparent, are attained and can be understood in detail, more particular description of the invention briefly summarized above may be had by reference to the embodiments thereof which are illustrated in the appended drawings, which drawings form a part of this specification. It is to be noted, however, that the appended drawings illustrate only typical embodiments of the invention and are therefore not to be considered limiting of its scope, for the invention may admit to other equally effective embodiments.

IN THE DRAWINGS

Figure 1:
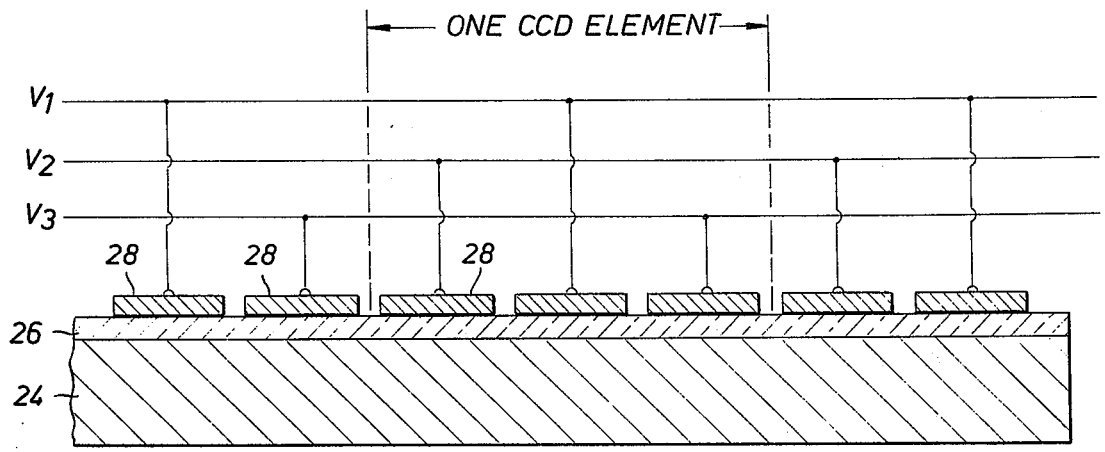

FIG. 1 is a cross-sectional view of a charge coupled device.

Figure 2:
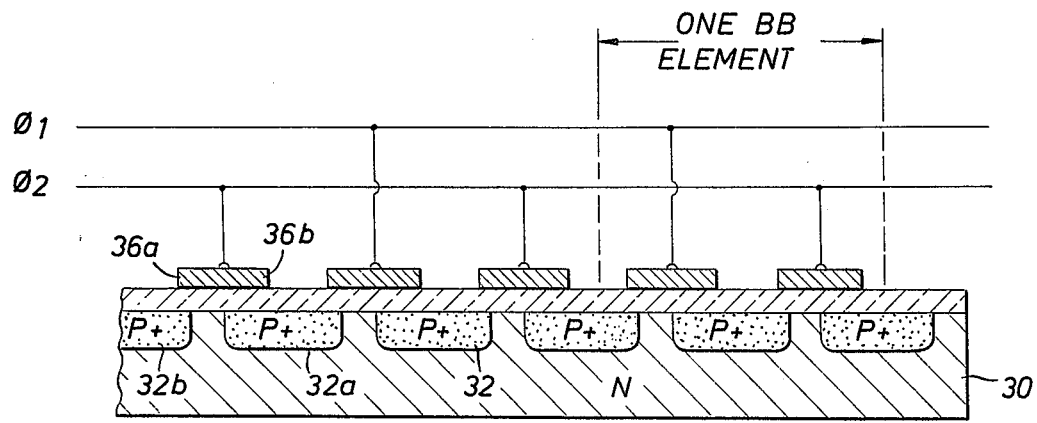

FIG. 2 is a cross-sectional view of a bucket brigade device.

Figure 3:
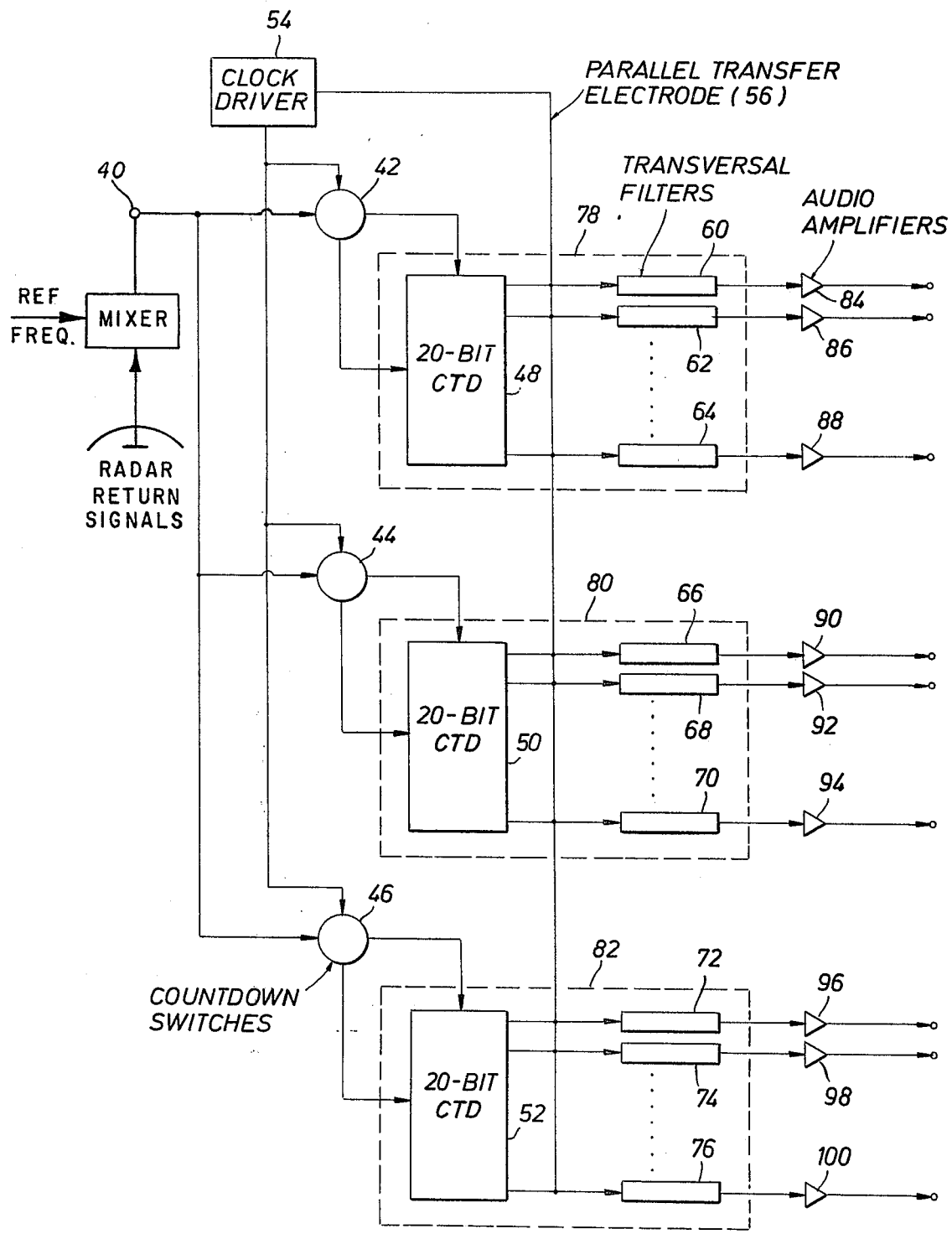

FIG. 3 is a block diagram of a preferred embodiment of the present invention showing how chips having a small number of range bins can be combined to realize a large number of range bins.

DESCRIPTION OF PREFERRED EMBODIMENTS

As set forth above, the present invention employs charge transfer devices, which includes both charge coupled devices and bucket brigade devices. Such devices are included as shift registers in both the demultiplexer and the transversal filters. As is understood by those skilled in the art, these structures are operable to store and transfer analogue signals. Further, charge transfer devices are particularly advantageous in that they are less complex than conventional shift registers and are accordingly less expensive.

Conventional semiconductor fabrication techniques may be utilized to construct the charge transfer devices; such techniques are well documented and need not be repeated herein. In general, a CCD stores charge in potential wells beneath electrodes, and moves charges stored in these wells along from electrode to electrode. By manipulating the charge along a series of electrodes, the CCD functions as a shift register. The basic structure of a three-phase CCD is illustrated in FIG. 1.

With reference to FIG. 1, a semiconductor substrate is shown at 24. The substrate is typically P-type silicon, but of course other semiconductor materials and conductivity types may be used. A relatively thin insulating layer 26 is formed over one surface of the substrate 24. A particularly suitable insulating material is silicon oxide, generally deposited to a thickness of less than 2000 A. A series of closely spaced electrodes shown generally at 28 are formed over the insulating layer 26. These electrodes typically may be spaced on the order of 3 microns or less. Three clock voltages $V_1, V_2$ and $V_3$ are required for the three phase CCD. When P-type silicon is used for the substrate, the clock voltages are positive.

In operation of the CCD, charge is stored in and transferred between potential wells. In the storage mode of a three phase CCD, a voltage $V_2$ is greater than the bias voltage $V_1$, and forms a potential well that "captures" the charge. In the transfer mode, charge moves along to the adjacent electrode when a still larger voltage $V_3$ is applied to that electrode, thus creating a larger potential well into which the charge is "dumped".

The bucket-brigade charge-transfer device is in essence a row of insulated gate field effect transistors (IGFET) with sources and drains connected and with the gates capacitively coupled to the drains. The basic structure of a BBD is shown in FIG. 2.

With reference to FIG. 2, a semiconductor substrate, typically N-type silicon, is shown at 30. A series of opposite conductivity type "islands" is formed in the surface of the substrate 30 by well known selective doping techniques. For the example illustrated in FIG. 2 these p+ regions are illustrated at 32, and respectively form source and drain electrodes of IGFETs of the BBD. A relatively thin (generally less than 2000A) insulating layer 34 of, e.g., silicon oxide is formed over the substrate and opposite conductivity type regions 32. Other insulating materials could be used of course.

Spaced apart conductive gate electrodes 36 are formed over the substrate. Each gate electrode extends over the region of the substrate 32 which lies between two of the P+ islands 32, i.e., the gate extends over the channel region. In the BBD structure, it will be noted, however, that the gate electrode extends over a significant portion of the drain region of the respective IGFETs. For example, consider the IGFET defined by source 32b, drain 32a (which define storage nodes), and gate 36a. A portion 36b of the gate 36a extends over a significant portion of the drain 32a. This produces an enlarged gate to drain capacitance which is used for charge storage in operation of the BBD.

The BBD device is operated utilizing two clock voltages $\phi_1$ and $\phi_2$. When it is desired to transfer charge from storage node 32b to 32a, the $\phi_2$ clock line is pulsed positive turning on the channel under the gate 36. Charge then flows from node 32b to node 32a until the magnitude of the potential of node 32b increases to the point where the channel stops conducting. Clock line $\phi_2$ is then pulsed off and clock line $\phi_1$ is pulsed on, initiating charge transfer from the node 32a to the next P+ region.

Now referring to FIG. 3, a gate range filter employing charge transfer devices is illustrated. There are two ways in which charge transfer devices are employed in range gate filtering in a moving target radar. First, such devices are used in demultiplexing or gating the input into the different time range bins. Second, such devices may be used in filtering.

In principle, a single CTD may be used to accomplish the required demultiplexing. For example, 60 time bins may be required and therefore a CTD accepting the input video signal and having 60 sites may be used. However, a more practical construction of a demultiplexer may be such as shown in FIG. 3. In this embodiment, the received (return) video signal is supplied together with a local reference frequency signal to a mixer M which generates difference signals applied as inputs to input terminal 40 and from there to each of three countdown switches 42, 44 and 46. These switches are, in turn, connected respectively to 20-bit CTD registers 48, 50 and 52. A clock driver 54 provides timing pulses to countdown switches 42, 44 and 46. These timing pulses have a repetition rate subtantially greater than the pulse repetition frequency (p.r.f.) of the radar transmitter and dependent upon the Nyquist rate corresponding to the degree of resolution in target identification that is required. In each cycle of 60 timing pulses, pulses 1–20 may be applied to gate 42, pulses 21–40 to gate 44 and pulses 41–60 to gate 46 to accomplish the necessary conversion to apparent 60-bit operation. However, other clocking schemes, as known in the art, may be employed to accomplish this result.

When charge target device shift registers 48, 50 and 52 are full, a clock signal is applied from the clock driver 54 to the parallel transfer electrode 56 to transfer out in parallel fashion the charge (data) stored in each of the 60 storage sites. The transferred charges are inputted to the transversal filters 60, 62, 64, 66, 68, 70, 72, 74 and 76. Actually, register 48 is connected to filters 60, 62 and 64 and to 17 other intervening filters not specifically shown; register 50 is connected to filters 66, 68 and 70 and 17 other intervening filters not shown; and register 52 is connected to filters 72, 74 and 76 and 17 other intervening filters not shown. Individual sites are connected to respective separate filters. The center frequency of the pass bands of the transversal filters is determined by the repetition rate of the pulses applied to gates 42, 44 and 46. The charges inputted into the transversal filters are clocked through the filters by pulses from the clock driver 54. The transfer pulses applied to transfer electrode 56 and the clock pulses applied to the transversal filters are at the p.r.f. of the radar. As mentioned above, the pulses applied to the gates 42, 44 and 46 have a repetition rate substantially greater than the p.r.f. and the charge transfer device shift registers 48, 50 and 52 are loaded in the intervals between the transfer pulses applied to the transfer electrode 56. During the interval between completion of loading of the shift registers 48, 50 and 52 and the end of the next transfer pulse applied to the transfer electrode 56, the gates 42, 44 and 46 are disabled.

Advantageously, the transversal filters connected to register 48 may be combined on the same semiconductor chip 78; the transversal filters connected to register 50 may be combined on the same chip 80; and the transversal filters connected to register 52 may be combined on the same chip 82.

The outputs from the transversal filters are connected to respective audio amplifiers 84, 86, 88, 90, 92, 94, 96, 98 and 100, as shown.

Each transversal filter comprises a semiconductor charge transfer device shift register having a plurality of charge storage sites, the charge level stored at each site being detected and the detected signals weighted with desired amplitude weighted factors. The weighting signals are then summed by a suitable amplifier to produce a correlated output signal from the filter.

Transversal frequency filters employing charge transfer devices are known in the art. One such device is disclosed in patent application Ser. No. 257,252, filed May 25, 1972 and now abandoned, "Transversal Frequency Filter", Dennis D. Buss, commonly assigned, and which is specifically incorporated herein by reference.

A transversal filter operates to achieve a desired spectral characteristic and such a filter can be made to produce a response having linear phase across the bandpass, operates with respect to extremely low signal levels and is characterized by extremely low levels of noise.

In application of the invention to a moving target radar, the frequency filtering can be performed in two different ways depending upon the mode of operation of the radar.

1. The frequency filter can be a broad band filter which rejects frequencies near zero and near the pulse repetition frequency but passes all frequencies inbetween. Such a filter rejects zero doppler (stationary targets) and low frequency doppler (e.g. wind blown leaves) but passes the return from moving targets. In such a mode of operation, a fixed frequency reference signal is applied to the mixer M.

2. The frequency filter can be narrow band with a center frequency corresponding to a particular doppler frequency thereby enhancing the signal to noise ratio (SNR) of the return at that particular doppler frequency. In this mode the reference frequency applied to the mixer M can be varied and is adjusted in order to match the doppler frequency of a target having arbitrary velocity to the center frequency of the bandpass filter. This mode is advantageous since the precise velocity of the target can be determined and the sensitivity of the radar is improved through higher SNR.

In a typical application, RF bursts from a radar transmitter last about 0.5 microseconds (i.e. a p.r.f. of 2000 r.p.s.) and are spaced apart by about 500 microseconds. Round trip time to a target in a range 100 meters away is approximately two-thirds of a microsecond. A typical relative movemment rate of 30 mph produces a 500 Hz doppler shift frequency. Charge transfer devices and related information processing devices for operating at these frequencies are wellknown in the art.

While particular embodiments of the invention have been shown, it will be understood that the invention is not limited thereto, since many modifications may be made and will become apparent to those skilled in the art.

What is claimed is:

1. A charge transfer device for frequency filtering each of a plurality of time segments of an applied input, comprising
    a demultiplexing charge transfer shift register having a plurality of sites for receiving and storing signals corresponding to respective time segments of an applied input signal,
    clocking means connected to said shift register for transferring data therethrough at a preselected rate so that each of said sites sequentially includes a signal for a separate time segment, and
    a plurality of charge transfer device filters connected to said respective sites of said demultiplexing shift register and to said clocking means,
    said clocking means transferring stored signals from said sites of said demultiplexing register into said filters so that only related time segment signals are applied to each of said filters,
    each of said filters having a passband for isolating a desired frequency or range of frequencies present in the time segment signal assigned thereto.

2. A charge transfer device as set forth in claim 1, wherein said demultiplexing charge transfer shift register and said plurality of charge transfer device filters are included on the same semiconductor chip.

3. A charge transfer device as set forth in claim 2, wherein said filters are transversal filters.

4. A charge transfer device as set forth in claim 3, wherein said filters have a broad bandpass characteristic.

5. A charge transfer device as set forth in claim 3, wherein said filters have a narrow bandpass characteristic.

6. A charge transfer device as set forth in claim 3, wherein said shift register and said filters are constructed as charge coupled devices.

7. A charge transfer device as set forth in claim 3, wherein said shift register and said filters are constructed as bucket brigade devices.

8. A charge transfer device as set forth in claim 1, wherein each of said filters has a broad bandpass characteristic.

9. A charge transfer device for frequency filtering each of a plurality of time segments of an applied input, comprising
    a demultiplexing charge transfer shift register having a plurality of sites for receiving and storing signals corresponding to respective time segments of an applied input signal,
    clocking means connected to apply clocking pulses to said shift register for transferring data therethrough at a preselected rate so that each of said sites sequentially includes a signal for a separate time segment,
    a plurality of transversal frequency filters connected to said respective sites of said demultiplexing shift register and to said clocking means,
    said clocking means transferring stored signals from said sites of said demultiplexing register into said transversal filters so that only related time segment signals are applied to each of said transversal filters, and
    means connected to each said transversal filter to obtain from said filter signals within the filter passband in the signal time segment assigned to that said transversal filter.

10. A charge transfer device as set forth in claim 9, wherein said demultiplexing charge transfer shift register includes a plurality of charge transfer devices each acting as a separate shift register and a plurality of countdown switches connected to respective ones of separate shift registers.

11. A charge transfer device as set forth in claim 9, wherein said demultiplexing charge transfer shift register and said plurality of transversal frequency filters are included on the same semiconductor chip.

12. A charge transfer device as set forth in claim 9, wherein said shift register comprises a charge coupled device shift register.

13. A charge transfer device as set forth in claim 9, wherein said shift register comprises a bucket brigade device shift register.

14. A charge transfer device as set forth in claim 9, wherein said transversal frequency filters include charge coupled devices.

15. A charge transfer device as set forth in claim 9, wherein said transversal frequency filters include bucket brigade devices.

* * * * *